United States Patent
Chen et al.

(10) Patent No.: US 9,392,688 B2
(45) Date of Patent: Jul. 12, 2016

(54) BIOMASS PHOTOSENSITIVE MATERIAL AND METHOD FOR MANUFACTURING THE SAME, AND PRINTED CIRCUIT BOARD

(71) Applicant: INDUSTRIAL TECHNOLOGY RESEARCH INSTITUTE, Hsinchu (TW)

(72) Inventors: Man-Lin Chen, Miaoli Hsien (TW); Hsien-Kuang Lin, Hsinchu (TW); Sue-May Chen, Taipei (TW); Su-Huey Chen, Hsinchu (TW); Yu-Lin Liu, Guanxi Township (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 0 days.

(21) Appl. No.: 14/792,772

(22) Filed: Jul. 7, 2015

(65) Prior Publication Data

US 2016/0004158 A1    Jan. 7, 2016

(30) Foreign Application Priority Data

Jul. 7, 2014  (TW) .............................. 103123273 A

(51) Int. Cl.
| | |
|---|---|
| *H05K 1/03* | (2006.01) |
| *H05K 3/28* | (2006.01) |
| *G03F 7/038* | (2006.01) |
| *H05K 1/02* | (2006.01) |

(52) U.S. Cl.
CPC ............ *H05K 1/0313* (2013.01); *G03F 7/0388* (2013.01); *H05K 1/02* (2013.01); *H05K 3/287* (2013.01)

(58) Field of Classification Search
CPC .............................. H05K 1/0313; H05K 3/287
See application file for complete search history.

(56) References Cited

U.S. PATENT DOCUMENTS

| | | | |
|---|---|---|---|
| 4,275,142 A | 6/1981 | Hosaka et al. |
| 5,529,888 A | 6/1996 | Watanabe et al. |
| 5,631,111 A | 5/1997 | Niu et al. |
| 5,731,128 A | 3/1998 | Kanda et al. |
| 5,741,622 A | 4/1998 | Arima |
| 5,753,722 A | 5/1998 | Itokawa et al. |
| 5,770,347 A | 6/1998 | Saitoh et al. |
| 5,876,899 A | 3/1999 | Szmanda et al. |
| 5,919,514 A | 7/1999 | Orlowski et al. |
| 5,948,514 A | 9/1999 | Komori et al. |
| 6,007,966 A | 12/1999 | Lin |
| 6,218,074 B1 | 4/2001 | Dueber et al. |
| 6,280,911 B1 | 8/2001 | Trefonas, III |
| 6,376,702 B1 | 4/2002 | Kai et al. |
| 6,399,672 B1 | 6/2002 | Ceska et al. |
| 6,432,613 B1 | 8/2002 | Chen et al. |
| 6,444,408 B1 | 9/2002 | Brock et al. |
| 6,610,465 B2 | 8/2003 | Rahman et al. |
| 6,653,048 B2 | 11/2003 | Brock et al. |
| 6,740,467 B2 | 5/2004 | Trefonas, III |
| 6,773,855 B1 | 8/2004 | Iijima et al. |
| 6,824,858 B2 | 11/2004 | Iwaida et al. |
| 6,844,130 B2 | 1/2005 | Nishikubo et al. |
| 6,867,282 B2 | 3/2005 | Nishikubo et al. |
| 6,893,784 B2 | 5/2005 | Kohiyama et al. |
| 7,018,785 B2 | 3/2006 | Ono et al. |
| 7,195,863 B2 | 3/2007 | Takano et al. |
| 7,226,710 B2 | 6/2007 | Nishikubo et al. |
| 2001/0044072 A1 | 11/2001 | Trefonas, III |
| 2002/0197555 A1 | 12/2002 | Rahman et al. |
| 2003/0064321 A1 | 4/2003 | Malik et al. |
| 2003/0170450 A1 | 9/2003 | Stewart et al. |
| 2007/0269670 A1 | 11/2007 | Wilmer et al. |
| 2009/0311441 A1 | 12/2009 | Bae et al. |
| 2010/0104981 A1 | 4/2010 | Choi et al. |
| 2012/0141937 A1 | 6/2012 | Lin et al. |
| 2013/0129941 A1 | 5/2013 | Zhao et al. |

FOREIGN PATENT DOCUMENTS

| | | |
|---|---|---|
| AU | 200024177 A1 | 10/2000 |
| CN | 1169742 A | 1/1998 |
| CN | 1287167 A | 3/2001 |
| CN | 1390898 A | 1/2003 |
| CN | 1900824 A | 1/2007 |
| CN | 101573663 A | 11/2009 |
| CN | 102298262 A | 12/2011 |
| CN | 102372826 A | 3/2012 |
| CN | 102388077 A | 3/2012 |
| CN | 102736411 A | 10/2012 |

(Continued)

OTHER PUBLICATIONS

Milovanovic, M. B. et al, "Preparation and modification of itaconic anhydride-methyl methacrylate copolymers," J. Serb. Chem. Soc., 2007, vol. 72, No. 12, pp. 1507-1514.

Okuda, T. et al, "Renewable Biobased Polymeric Materials: Facile Syntehsis of Itaconic Anhydride-Based Copolymers with Poly(L-lactic acid) Grafts," Macromolecules, 2012, vol. 45, pp. 4166-4174.

Osman, S.M. et al, "Microwave synthesis and thermal properties of polyacrylate derivatives containing itaconic anhydride moieties," Chemistry Central Journal, 2012, vol. 6, pp. 1-11.

Otsu, T. et al, "Radical Polymerization of Itaconic Anhydride and Reactions of the Resulting Polymers with Amines and Alcohols," Polymer International, 1991, vol. 25, pp. 245-251.

(Continued)

*Primary Examiner* — Jeremy C Norris
(74) *Attorney, Agent, or Firm* — Birch, Stewart, Kolasch & Birch, LLP

(57) ABSTRACT

A method of forming a biomass photosensitive material is provided, which includes (1) polymerizing (a) itaconic anhydride and (b) acrylate to form a copolymer, and (2) mixing the copolymer and (c) monomer with a single hydroxy group and a carbon-carbon double bond for a ring-opening addition reaction, wherein the (a) itaconic anhydride and the single hydroxy group of the (c) monomer with the single hydroxy group and the carbon-carbon double bond are reacted in the ring-opening addition reaction.

20 Claims, No Drawings

(56) References Cited

FOREIGN PATENT DOCUMENTS

| TW | 268011 B | 1/1996 |
|----|----------|--------|
| TW | 369557 B | 9/1999 |
| TW | 475097 B | 2/2002 |
| TW | 538318 B | 6/2003 |
| TW | 200619848 A | 6/2006 |
| TW | 200643041 A | 12/2006 |
| TW | 200732432 A | 9/2007 |
| TW | 200804081 A | 1/2008 |
| TW | 200809398 A | 2/2008 |
| TW | I346130 B | 8/2011 |
| TW | 201241561 A | 10/2012 |
| TW | I385487 B | 2/2013 |
| TW | I420244 B | 12/2013 |
| WO | 2013/148842 A1 | 10/2013 |

OTHER PUBLICATIONS

Shang, S. et al, "Synthesis and characterization of itaconic anhydride and stearyl methacrylate copolymers," Polymer, 2009, vol. 50, pp. 3119-3127.

Taiwan Office Action dated Aug. 17, 2015 for Appl. No. 103123273.

Taiwan Office Action dated Mar. 18, 2015 for Appl. No. 103123273.

BIOMASS PHOTOSENSITIVE MATERIAL AND METHOD FOR MANUFACTURING THE SAME, AND PRINTED CIRCUIT BOARD

CROSS REFERENCE TO RELATED APPLICATIONS

The present application is based on, and claims priority from, Taiwan Application Serial Number 103123273, filed on Jul. 7, 2014, the disclosure of which is hereby incorporated by reference herein in its entirety.

TECHNICAL FIELD

The technical field relates to a biomass photosensitive material, a printed circuit board using the same and a method of manufacturing the biomass photosensitive material.

BACKGROUND

In the manufacture of printed circuit boards, outer lines should be protected by anti-soldering treatment after they are completed, to prevent oxidation of the outer lines or a welding short. In general, anti-soldering treatments involve a solder mask being coated on a surface of the circuit board by screen printing, roll coating, or electrostatic spraying, after which it is pre-baked and cooled, and then exposed and developed to remove the undesired part of the solder mask. The remaining solder mask can be completely cured by high-temperature baking, thereby forming the anti-soldering layer to protect circuits of the circuit board.

However, the major part of the common anti-soldering layer is petrochemical raw material. A lot of waste that is not biodegradable is produced when manufacturing the printed circuit boards. Accordingly, a part of the composition in the anti-soldering layer should be replaced by a biomass material to lower dependence on the petrochemical raw material, and for protecting the environment.

SUMMARY

One embodiment of the disclosure provides a biomass photosensitive material, comprising: a product of a ring-opening addition reaction from a copolymer and (c) monomer with a single hydroxy group and a carbon-carbon double bond, wherein the copolymer is polymerized of (a) itaconic anhydride and (b) acrylate, and the (a) itaconic anhydride and the single hydroxy group of the (c) monomer with the single hydroxy group are reacted in the ring-opening addition reaction.

One embodiment of the disclosure provides a printed circuit board, comprising: an integrated circuit; and an anti-solder layer on the integrated circuit, and the anti-solder layer is formed by pattering a photoresist material; wherein the photoresist material includes the biomass photosensitive material and a photo initiator.

One embodiment of the disclosure provides a method for manufacturing a biomass photosensitive material, comprising: (1) polymerizing (a) itaconic anhydride and (b) acrylate to form a copolymer; and (2) mixing the copolymer and (c) monomer with a single hydroxy group and a carbon-carbon double bond for a ring-opening addition reaction to form a biomass photosensitive material, wherein the (a) itaconic anhydride and the single hydroxy group of the (c) monomer with the single hydroxy group and the carbon-carbon double bond are reacted in the ring-opening addition reaction.

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

One embodiment provides a method for manufacturing biomass photosensitive material. First, (1) polymerizing (a) itaconic anhydride and (b) acrylate to form a copolymer, as shown in Formula 1.

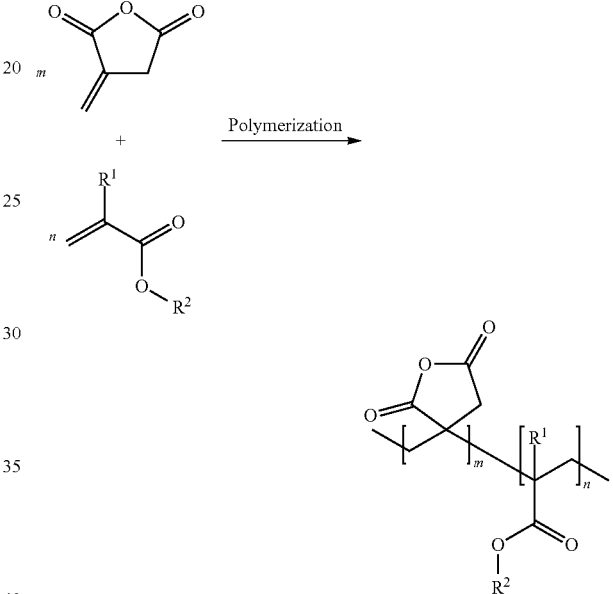

(Formula 1)

In one embodiment, the copolymer in Formula 1 is a random copolymer. In Formula 1, m and n are molar ratios, $R^1$ is H or $C_{1-10}$ alkyl group, and $R^2$ is $C_{1-10}$ alkyl group. In one embodiment, the (a) itaconic anhydride and the (b) acrylate have a molar ratio (m/n) of 1:0.8 to 1:5. An overly high ratio of the (b) acrylate results in an insufficient amount of the monomer with the carbon-carbon double bond (or an insufficient amount of the carboxyl group), thereby negatively influencing the thermal resistance of the anti-soldering ink and producing a scum. An overly low amount of the (b) acrylate makes the polymerization be difficult, or results in an over development due to introducing too many carboxyl groups. In one embodiment, the (b) acrylate includes methyl methacrylate, butyl methacrylate, butyl acrylate, isooctyl acrylate, isobornyl acrylate, or a combination thereof.

Subsequently, (2) mixing the copolymer in Formula 1 with (c) monomer with a single hydroxy group and a carbon-carbon double bond for a ring-opening addition reaction to form a biomass photosensitive material, wherein the (a) itaconic anhydride and the hydroxy group of the (c) monomer with the single hydroxy group and the carbon-carbon double bond are reacted in the ring-opening addition reaction to form the biomass photosensitive material. For example, while the (c) monomer with the single hydroxy group and the carbon-carbon double bond is 2-hydroxyethyl acrylate, the ring-opening addition reaction is shown as Formula 2. The product of the ring-opening addition reaction includes carbon-carbon double bonds and carboxyl groups, the carbon-carbon double bonds are beneficial to polymerize an exposed part of the biomass photosensitive material, and the carboxyl group is beneficial to dissolve an un-exposed part of the biomass photosensitive material in an alkaline developer.

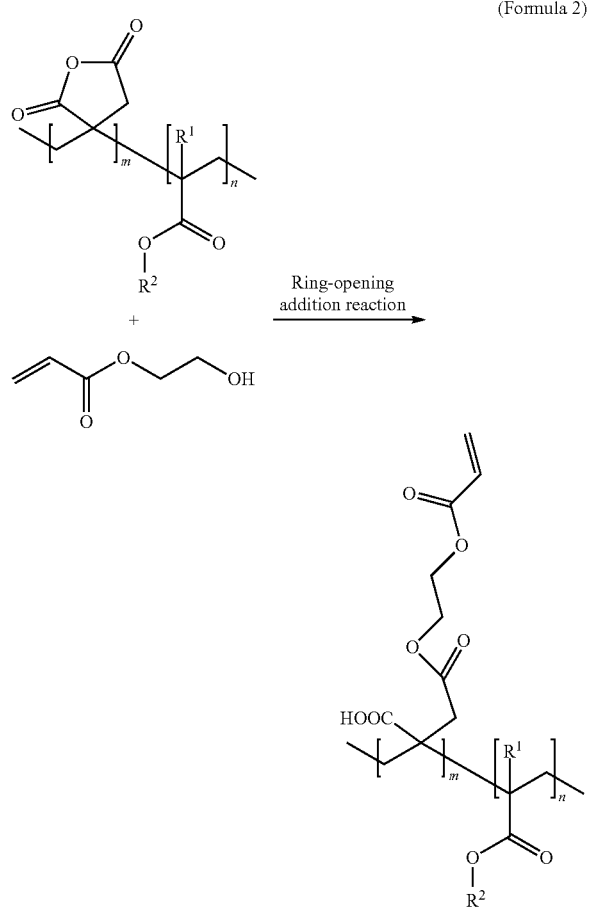

In one embodiment, the (c) monomer with the single hydroxy group and the carbon-carbon double bond can be pentaerythritol triacrylate, 2-hydroxyethyl acrylate, or a combination thereof. A monomer with at least two hydroxy groups may crosslink to gel the reaction. In one embodiment, the (a) itaconic anhydride and the (c) monomer with the single hydroxy group and the carbon-carbon double bond have a molar ratio of 1:0.2 to 1:1. An overly low ratio of the (c) monomer with the hydroxy group and the carbon-carbon double bond may negatively influence the thermal resistance of the anti-soldering ink.

Note that all the (a) itaconic anhydride of the copolymer in Formula 2 are reacted with the (c) monomer with the single hydroxy group and the carbon-carbon double bond in the ring-opening addition reaction, however, some part of the (a) itaconic anhydride remains and is not ring-opened in practice. In some embodiment, (d) polylactic acid or (e) water, alcohol, or a combination can be further added, and their hydroxy group may react with the (a) itaconic anhydride in the ring-opening addition reaction. The (d) polylactic acid is beneficial to increase the biomass material concentration of the biomass photosensitive material. In one embodiment, the (a) itaconic anhydride and the (d) polylactic acid have a molar ratio of 1:0.005 to 1:0.7. An overly high ratio of the polylactic acid may result in an insufficient amount of the monomer with the single hydroxy group and the carbon-carbon bond, thereby negatively influencing the thermal resistance of the anti-soldering ink. The (e) water, alcohol, or a combination thereof may modify the optimal ratio of the monomer with the hydroxy group and the carbon-carbon double bond and the carboxyl group on time. In one embodiment, the (a) itaconic anhydride and the (e) water, alcohol, or a combination have a molar ratio of 1:0.001 to 1:0.3. An overly high ratio of the (e) water, alcohol, or a combination may result in an insufficient amount of the monomer with the single hydroxy group and the carbon-carbon bond.

In one embodiment, the biomass photosensitive material may collocate with other material to serve as a photoresist material applied in the printed circuit boards. For example, the anti-soldering layer on an integrated circuit of the printed circuit board can be formed by pattering the photoresist material. The photoresist material includes the biomass photosensitive material and a photo initiator. In one embodiment, the photoresist material may further include epoxy resin, inorganic filler, thermal curing agent, defoamer, diluent, or a combination thereof if necessary.

Below, exemplary embodiments will be described in detail so as to be easily realized by a person having ordinary knowledge in the art. The inventive concept may be embodied in various forms without being limited to the exemplary embodiments set forth herein. Descriptions of well-known parts are omitted for clarity.

EXAMPLES

Example 1

65 g of methyl methacrylate (MMA), 35 g of itaconic anhydride (IA), and 100 g of propylene glycol methyl ether acetate (PGMEA) were mixed and heated to 80° C., and then stirred at 80° C. for 30 minutes to be dissolved as a single-phase solution. The solution was cooled to room temperature, and 1.5 g of azobisisobutyronitrile (AIBN) was added to the solution. The mixture was stirred to be dissolved, thereby obtaining a solution I.

40 g of PGMEA was heated to 110° C. and stirred under nitrogen, and the solution I was slowly and dropwisely added into the PGMEA. After the addition of the solution I was completed, the solution was continuously reacted at 110° C. for at least 12 hours to obtain a resin A. The resin A was a copolymer of IA and MMA.

Example 2

50 g of MMA, 40 g of IA, 10 g of butyl methacrylate (BMA), and 100 g of PGMEA were mixed and heated to 80° C., and then stirred at 80° C. for 30 minutes to be dissolved as a single-phase solution. The solution was cooled to room temperature, and 1.5 g of AIBN was added to the solution. The mixture was stirred to be dissolved, thereby obtaining a solution II.

40 g of PGMEA was heated to 110° C. and stirred under nitrogen, and the solution II was slowly and dropwisely added into the PGMEA. After the addition of the solution II was completed, the solution was continuously reacted at 110° C. for at least 12 hours to obtain a resin B. The resin B was a copolymer of IA, MMA, and BMA.

Example 3

35 g of MMA, 50 g of IA, 15 g of BMA, and 100 g of PGMEA were mixed and heated to 80° C., and then stirred at 80° C. for 30 minutes to be dissolved as a single-phase solution. The solution was cooled to room temperature, and 1.5 g of AIBN was added to the solution. The mixture was stirred to be dissolved, thereby obtaining a solution III.

40 g of PGMEA was heated to 110° C. and stirred under nitrogen, and the solution III was slowly and dropwisely added into the PGMEA. After the addition of the solution III was completed, the solution was continuously reacted at 110° C. for at least 12 hours to obtain a resin C. The resin C was a copolymer of IA, MMA, and BMA.

Example 4

75 g of MMA, 25 g of IA, and 100 g of carbitol acetate (CBA) were mixed and heated to 80° C., and then stirred at 80° C. for 30 minutes to be dissolved as a single-phase solution. The solution was cooled to room temperature, and 1.5 g of AIBN was added to the solution. The mixture was stirred to be dissolved, thereby obtaining a solution IV.

40 g of CBA was heated to 110° C. and stirred under nitrogen, and the solution IV was slowly and dropwisely added into the CBA. After the addition of the solution IV was completed, the solution was continuously reacted at 110° C. for at least 12 hours to obtain a resin D. The resin D was a copolymer of IA and MMA.

Example 5

60 g of MMA, 30 g of IA, 10 g of BMA, and 100 g of CBA were mixed and heated to 80° C., and then stirred at 80° C. for 30 minutes to be dissolved as a single-phase solution. The solution was cooled to room temperature, and 1.5 g of AIBN was added to the solution. The mixture was stirred to be dissolved, thereby obtaining a solution V.

40 g of CBA was heated to 110° C. and stirred under nitrogen, and the solution V was slowly and dropwisely added into the CBA. After the addition of the solution V was completed, the solution was continuously reacted at 110° C. for at least 12 hours to obtain a resin E. The resin E was a copolymer of IA, MMA, and BMA.

Example 6

35 g of MMA, 50 g of IA, 15 g of BMA, and 100 g of CBA were mixed and heated to 80° C., and then stirred at 80° C. for 30 minutes to be dissolved as a single-phase solution. The solution was cooled to room temperature, and 1.5 g of AIBN was added to the solution. The mixture was stirred to be dissolved, thereby obtaining a solution VI.

40 g of CBA was heated to 110° C. and stirred under nitrogen, and the solution VI was slowly and dropwisely added into the CBA. After the addition of the solution VI was completed, the solution was continuously reacted at 110° C. for at least 12 hours to obtain a resin F. The resin F was a copolymer of IA, MMA, and BMA.

Comparative Example 1

60 g of MMA, 40 g of IA, and 100 g of PGMEA were mixed and heated to 80° C., and then stirred at 80° C. for 30 minutes to be dissolved as a multi-phase solution. The solution was cooled to room temperature, and 1.5 g of AIBN was added to the solution. The mixture was stirred to be dissolved, thereby obtaining a solution VII.

40 g of PGMEA was heated to 110° C. and stirred under nitrogen, and the solution VII was slowly and dropwisely added into the PGMEA. After the addition of the solution VII was completed, the solution was continuously reacted at 110° C. for at least 12 hours to obtain a resin G. The resin G was a copolymer of IA and MMA. As shown in Examples 1-3 and Comparative Example 1, the IA amount could be increased when the acrylate utilized BMA. If only MMA was selected as the acrylate, a high amount of IA would result in a multi-phase problem.

Comparative Example 2

70 g of MMA, 30 g of IA, and 100 g of CBA were mixed and heated to 80° C., and then stirred at 80° C. for 30 minutes to be dissolved as a multi-phase solution. The solution was cooled to room temperature, and 1.5 g of AIBN was added to the solution. The mixture was stirred to be dissolved, thereby obtaining a solution VIII.

40 g of CBA was heated to 110° C. and stirred under nitrogen, and the solution VIII was slowly and dropwisely added into the CBA. After the addition of the solution VIII was completed, the solution was continuously reacted at 110° C. for at least 12 hours to obtain a resin H. The resin H was a copolymer of IA and MMA. As shown in Examples 4-6 and Comparative Example 2, the IA amount could be increased when the acrylate utilized BMA. If only MMA was selected as the acrylate, a high amount of IA would result in a multi-phase problem.

The amounts of the raw materials and the appearance of the solutions in Examples 1-3 and Comparative Example 1 are listed in Table 1, and the amounts of the raw materials and the appearance of the solutions in Examples 4-6 and Comparative Example 2 are listed in Table 2.

TABLE 1

| Sample | Example 1 | Example 2 | Example 3 | Comparative Example 1 |
| --- | --- | --- | --- | --- |
| AIBN vs. acrylate | 1.5% | 1.5% | 1.5% | 1.5% |
| MMA (weight ratio) | 0.65 | 0.5 | 0.35 | 0.6 |
| IA (weight ratio) | 0.35 | 0.4 | 0.5 | 0.4 |
| BMA (weight ratio) | 0 | 0.1 | 0.15 | 0 |
| Solvent | PGMEA | PGMEA | PGMEA | PGMEA |
| Biomass material concentration | 35% | 40% | 50% | 40% |
| Result | Single-phase | Single-phase | Single-phase | Multi-phase |

TABLE 2

| Sample | Example 4 | Example 5 | Example 6 | Comparative Example 2 |
| --- | --- | --- | --- | --- |
| AIBN vs. acrylate | 1.5% | 1.5% | 1.5% | 1.5% |
| MMA (weight ratio) | 0.75 | 0.6 | 0.35 | 0.7 |
| IA (weight ratio) | 0.25 | 0.3 | 0.5 | 0.3 |
| BMA (weight ratio) | 0 | 0.1 | 0.15 | 0 |
| Solvent | CBA | CBA | CBA | CBA |
| Biomass material concentration | 25% | 30% | 50% | 30% |
| Result | Single-phase | Single-phase | Single-phase | Multi-phase |

Example 7

200 g of the resin A in Example 1 (solid content of 41.4%) was heated to 105° C. and stirred at 105° C. under air for 15 minutes. 34.87 g of pentaerythritol triacrylate (SR444), 15 g of 2-hydroxyethyl acrylate (HEA), 0.3 g of hydroquinone monomethyl ether (MEHQ), 0.6 g of ethanol, and 19 g of PGMEA were added into the stirred resin A to form a mixture with a solid content of about 50%. The mixture was evenly mixed, and 1 g of triphenylphosphine (TPP) was then added into the mixture to react for at least 8 hours, thereby obtaining a resin I. The IA part in the copolymer of the IA and the MMA (resin A) was reacted with the hydroxy group of the SR444, the HEA, the ethanol, and the MEHQ in a ring-opening addition reaction to form the resin I. The resin I includes carbon-carbon double bonds (from the SR444 and the HEA) and carboxyl groups (from the ring-opened IA).

Example 8

200 g of the resin C in Example 3 (solid content of 41.4%) was heated to 105° C. and stirred at 105° C. under air for 15 minutes. 54.5 g of SR444, 21.36 g of HEA, 0.3 g of MEHQ, and 41.8 g of PGMEA were added into the stirred resin C to form a mixture with a solid content of about 50%. The mixture was evenly mixed, and 1 g of TPP was then added into the mixture to react for at least 8 hours, thereby obtaining a resin J. The IA part in the copolymer of the IA, the BMA, and the MMA (resin C) was reacted with the hydroxy group of the SR444, the HEA, and the MEHQ in a ring-opening addition reaction to form the resin J. The resin J includes carbon-carbon double bonds (from the SR444 and the HEA) and carboxyl groups (from the ring-opened IA).

Example 9

200 g of the resin D in Example 4 (solid content of 41.4%) was heated to 105° C. and stirred at 105° C. under air for 15 minutes. 27.5 g of SR444, 10.7 g of HEA, 0.3 g of MEHQ, and 3.8 g of CBA were added into the stirred resin D to form a mixture with a solid content of about 50%. The mixture was evenly mixed, and 1 g of TPP was then added into the mixture to react for at least 8 hours, thereby obtaining a resin K. The IA part in the copolymer of the IA and the MMA (resin D) was reacted with the hydroxy group of the SR444, the HEA, and the MEHQ in a ring-opening addition reaction to form the resin K. The resin K includes carbon-carbon double bonds (from the SR444 and the HEA) and carboxyl groups (from the ring-opened IA).

Example 10

200 g of the resin F in Example 6 (solid content of 41.4%) was heated to 105° C. and stirred at 105° C. under air for 15 minutes. 54.5 g of SR444, 21.36 g of HEA, 0.3 g of MEHQ, and 41.8 g of CBA were added into the stirred resin F to form a mixture with a solid content of about 50%. The mixture was evenly mixed, and 1 g of TPP was then added into the mixture to react for at least 8 hours, thereby obtaining a resin L. The IA part in the copolymer of the IA, the BMA, and the MMA (resin F) was reacted with the hydroxy group of the SR444, the HEA, and the MEHQ in a ring-opening addition reaction to form the resin L. The resin L includes carbon-carbon double bonds (from the SR444 and the HEA) and carboxyl groups (from the ring-opened IA).

Example 11

200 g of the resin F in Example 6 (solid content of 41.4%) was heated to 105° C. and stirred at 105° C. under air for 15 minutes. 73.6 g of polylactic acid (PLA with a weight average molecular weight of about 1000), 34.7 g of HEA, 0.3 g of MEHQ, and 74 g of CBA were added into the stirred resin F to form a mixture with a solid content of about 50%. The mixture was evenly mixed, and 1 g of TPP was then added into the mixture to react for at least 8 hours, thereby obtaining a resin M. The IA part in the copolymer of the IA, the BMA, and the MMA (resin F) was reacted with the hydroxy group of the polylactic acid, the HEA, and the MEHQ in a ring-opening addition reaction to form the resin M. The resin M includes carbon-carbon double bonds (from the HEA) and carboxyl groups (from the ring-opened IA). Replacing the SR444 by the PLA could largely increase the biomass material concentration of the resin M.

TABLE 3

| Sample | | | Example 7 | | Example 8 | | Example 9 |
| --- | --- | --- | --- | --- | --- | --- | --- |
| Solid content | | | 50% | | 50% | | 50% |
| | | | Molar ratio | | Molar ratio | | Molar ratio |
| Raw material molar ratio | Resin A | MMA | 2.08 | Resin C MMA | 0.7839 | Resin D MMA | 3.36 |
| | | IA | 1 | IA | 1 | IA | 1 |
| | | | | BMA | 0.236 | BMA | 0 |
| | | SR444 | 0.45 | SR444 | 0.5 | SR444 | 0.5 |
| | | HEA | 0.5 | HEA | 0.5 | HEA | 0.5 |
| | | Ethanol | 0.05 | Ethanol | 0 | Ethanol | 0 |
| | | MEHQ | 0.8% | MEHQ | 0.8% | MEHQ | 0.8% |
| | | TPP | 2% | TPP | 2% | TPP | 2% |
| | | Solvent | PMEGA | Solvent | PMEGA | Solvent | CBA |
| Biomass material concentration | | | 20% | | 26% | | 17% |
| Test of 1% sodium carbonate developer | | | ◉ | | ◉ | | ○ |

TABLE 4

| Sample | Example 10 | | | Example 11 | | |
|---|---|---|---|---|---|---|
| Solid content | 50% | | | 50% | | |
| | | | Molar ratio | | | Molar ratio |
| Raw material molar ratio | Resin F | MMA | 0.7839 | Resin F | MMA | 0.7839 |
| | | IA | 1 | | IA | 1 |
| | | BMA | 0.236 | | BMA | 0.236 |
| | SR444 | | 0.5 | HEA | | 0.8 |
| | HEA | | 0.5 | PLA | | 0.2 |
| | Ethanol | | 0 | EtOH or H2O | | 0 |
| | MEHQ | | 0.8% | MEHQ | | 0.2% |
| | TPP | | 2% | TPP | | 2% |
| | Solvent | | CBA | Solvent | | CBA |
| Biomass material concentration | | 26% | | | 60% | |
| Test of 1% sodium carbonate developer | | ⊚ | | | ⊚ | |

Example 12

The resin M in Example 11 was collocated other materials in Table 5 to be grinded by a three-roller mill to prepare Agent A.

TABLE 5

| Agent A | Weight (g) |
|---|---|
| Resin M | 260 |
| Photo initiator IRGACURE 907(Ciba) | 10 |
| Isopropyl thioxanthone (ITX) | 4 |
| Silicone type defoamer (DC350) | 1 |
| Dipentaerythritol penta-/hexa-acrylate (DPHA) | 10 |
| Silica micropowder | 5 |
| MEHQ | 0.5 |

TABLE 5-continued

| Agent A | Weight (g) |
|---|---|
| Carboxybenzotriazole (CBT) | 1 |
| Barium sulfate | 40 |
| Curing agent (2PHz) | 1 |
| Dye (Phthalocyanine green) | 1 |

The compositions in Table 6 were grinded by a three-roller mill to prepare Agent B.

TABLE 6

| Agent B | Weight (g) |
|---|---|
| DPHA | 10 |
| Barium sulfate | 20 |
| bixylenol epoxy resin (YX4000) | 25 |
| PGMEA | 30 |

The agent A and the Agent B (1:1) were used to prepare an anti-soldering ink (photoresist material). The anti-soldering ink was screen printed on a printed circuit board, baked at 80° C. for 30 minutes, and patterned by lithography to observe the properties of the patterned photoresist material (e.g. photosensitivity, developing property, adhesion, resolution, and the like). The patterned photoresist material was then baked at 150° C. for 1 hour to complete the anti-soldering ink layer to test its thermal resistance, hardness, acid resistance, and the like.

TABLE 7

| | Process condition | | Result | | | | | | |
|---|---|---|---|---|---|---|---|---|---|
| Sample | Exposure property | Development | Photo-sensitivity | Resolution | Adherence | Thermal resistance (260° C., 10 sec) | Hardness | Acid resistance 10% HCl, 10 min | Biomass material concentration |
| Example 12 | Exposure to 300 mJ/cm² | Develop at 31° C. for 60 sec | 9/21 | 50 μm | 50 μm | pass | 6 H | pass | ~40% |
| | Exposure to 500 mJ/cm² | Developed at for 31° C. 60 sec | 11/21 | 50 μm | 50 μm | | | | |
| | Exposure to 700 mJ/cm² | Developed at 31° C. for 60 sec | 13.5/21 | 80 μm | 50 μm | | | | |

As shown in Table 7, the anti-soldering ink had excellent photosensitivity, good developing properties, adherence, resolution, thermal soldering resistance, hardness, acid resistance, and the like.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:
1. A biomass photosensitive material, comprising:
   a product of a ring-opening addition reaction from a copolymer and (c) monomer with a single hydroxy group and a carbon-carbon double bond, wherein the copolymer is polymerized of (a) itaconic anhydride and (b) acrylate, and the (a) itaconic anhydride and the single hydroxy group of the (c) monomer with the single hydroxy group are reacted in the ring-opening addition reaction.

2. The biomass photosensitive material as claimed in claim 1, comprising a plurality of carbon-carbon double bonds and a plurality of carboxyl groups.

3. The biomass photosensitive material as claimed in claim 1, wherein the (a) itaconic anhydride and the (b) acrylate have a molar ratio of 1:0.8 to 1:5, and the (a) itaconic anhydride and the (c) the monomer with the single hydroxy group and the carbon-carbon double bond have a molar ratio of 1:0.2 to 1:1.

4. The biomass photosensitive material as claimed in claim 1, wherein the (b) acrylate comprises methyl methacrylate, butyl methacrylate, butyl acrylate, isooctyl acrylate, isobornyl acrylate, or a combination thereof.

5. The biomass photosensitive material as claimed in claim 1, wherein the (c) the monomer with the single hydroxy group and the carbon-carbon double bond comprises pentaerythritol triacrylate, 2-hydroxyethyl acrylate, or a combination thereof.

6. The biomass photosensitive material as claimed in claim 1, further comprising (d) polylactic acid to react with the copolymer in the ring-opening addition reaction, wherein the (a) itaconic anhydride and a hydroxy group of the (d) polylactic acid are reacted in the ring-opening addition reaction.

7. The biomass photosensitive material as claimed in claim 6, wherein the (a) itaconic anhydride and the (d) poly lactic acid have a molar ratio of 1:0.005 to 1:0.7.

8. The biomass photosensitive material as claimed in claim 1, further comprising (e) water, alcohol, or a combination thereof to react with the copolymer in the ring-opening addition reaction, wherein the (a) itaconic anhydride and a hydroxy group of the (e) water, alcohol, or a combination thereof are reacted in the ring-opening reaction.

9. The biomass photosensitive material as claimed in claim 8, wherein the (a) itaconic anhydride and the (e) water, alcohol, or a combination thereof have a molar ratio of 1:0.001 to 1:0.3.

10. A printed circuit board, comprising: an integrated circuit; and an anti-solder layer on the integrated circuit, and the anti-solder layer is formed by patterning a photoresist material; wherein the photoresist material includes the biomass photosensitive material as claimed in claim 1 and a photo initiator.

11. The printed circuit board as claimed in claim 10, wherein the photoresist material further comprises acrylate monomer, epoxy resin, inorganic filler, thermal curing agent, defoamer, diluent, thermal inhibitor, or a combination thereof.

12. A method for manufacturing a biomass photosensitive material, comprising:
(1) polymerizing (a) itaconic anhydride and (b) acrylate to form a copolymer; and
(2) mixing the copolymer and (c) monomer with a single hydroxy group and a carbon-carbon double bond for a ring-opening addition reaction to form a biomass photosensitive material,
wherein the (a) itaconic anhydride and the single hydroxy group of the (c) monomer with the single hydroxy group and the carbon-carbon double bond are reacted in the ring-opening addition reaction.

13. The method as claimed in claim 12, wherein the biomass photosensitive material includes a plurality of carbon-carbon double bonds and a plurality of carboxyl groups.

14. The method as claimed in claim 12, wherein the (a) itaconic anhydride and the (b) acrylate have a molar ratio of 1:0.8 to 1:5, and the (a) itaconic anhydride and the (c) the monomer with the single hydroxy group and the carbon-carbon double bond have a molar ratio of 1:0.2 to 1:1.

15. The method as claimed in claim 12, wherein the (b) acrylate comprises methyl methacrylate, butyl methacrylate, butyl acrylate, isooctyl acrylate, isobornyl acrylate, or a combination thereof.

16. The method as claimed in claim 12, wherein the (c) the monomer with the single hydroxy group and the carbon-carbon double bond comprises pentaerythritol triacrylate, 2-hydroxyethyl acrylate, or a combination thereof.

17. The method as claimed in claim 12, further comprising adding (d) polylactic acid into step (2) to react with the copolymer in the ring-opening addition reaction, wherein the (a) itaconic anhydride and a hydroxy group of the (d) polylactic acid are reacted in the ring-opening addition reaction.

18. The method as claimed in claim 17, wherein the (a) itaconic anhydride and the (d) poly lactic acid have a molar ratio of 1:0.005 to 1:0.7.

19. The method as claimed in claim 12, further comprising adding (e) water, alcohol, or a combination thereof into step (2) to react with the copolymer in the ring-opening addition reaction, wherein the (a) itaconic anhydride and a hydroxy group of the (e) water, alcohol, or a combination thereof are reacted in the ring-opening reaction.

20. The method as claimed in claim 19, wherein the (a) itaconic anhydride and the (e) water, alcohol, or a combination thereof have a molar ratio of 1:0.001 to 1:0.3.

\* \* \* \* \*